United States Patent
Kamali

(10) Patent No.: US 10,069,502 B2
(45) Date of Patent: Sep. 4, 2018

(54) METHOD FOR PPL AND CDR DESIGNS FOR ACHIEVING SPECIFIC BANDWIDTH AND PHASE MARGIN REQUIREMENTS

(71) Applicant: SAMSUNG DISPLAY CO., LTD., Yongin, Gyeonggi-Do (KR)

(72) Inventor: Jalil Kamali, San Jose, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 531 days.

(21) Appl. No.: 14/712,795

(22) Filed: May 14, 2015

(65) Prior Publication Data

US 2016/0036451 A1 Feb. 4, 2016

Related U.S. Application Data

(60) Provisional application No. 62/031,786, filed on Jul. 31, 2014.

(51) Int. Cl.
*G01R 31/28* (2006.01)
*H03L 7/00* (2006.01)

(52) U.S. Cl.
CPC .......... *H03L 7/00* (2013.01); *Y10T 29/49004* (2015.01)

(58) Field of Classification Search
CPC ....... H04L 7/0087; H04L 7/005; H04L 7/087; H04L 7/0893; H04L 7/22; Y10T 29/49002; Y10T 29/413; Y10T 29/49128
USPC ...... 29/593, 832, 831; 331/17, 108 D, 117 R
See application file for complete search history.

(56) References Cited

U.S. PATENT DOCUMENTS

| 5,745,012 A * | 4/1998 | Oka .......................... H03B 5/32 331/108 D |
| 6,873,214 B2 * | 3/2005 | Harwood ............... H03L 7/0893 331/17 |
| 7,268,630 B2 * | 9/2007 | Rhee ..................... H03L 7/0898 331/117 R |
| 2007/0057736 A1 | 3/2007 | Baird et al. |

FOREIGN PATENT DOCUMENTS

| JP | 2014-60583 | 4/2014 |
| KR | 10-0707230 | 4/2007 |

OTHER PUBLICATIONS

KR Publication No. 10-2006-0106552 A dated Oct. 12, 2006 corresponds to KR 10-0707230 dated Apr. 6, 2007 listed above.

* cited by examiner

*Primary Examiner* — Donghai D Nguyen
(74) *Attorney, Agent, or Firm* — Lewis Roca Rothgerber Christie LLP

(57) ABSTRACT

A method for designing a PLL or CDR circuit, either of which may contain a loop with a voltage controlled oscillator or other frequency controlled source. For each of a set of values of a gain parameter and a first capacitor of the loop filter of this loop, an analytic solution is employed to find a value for a resistor and a second capacitor of the loop filter. Values of the resistor and second capacitor that meet a design criterion are selected from among the calculated values.

18 Claims, 10 Drawing Sheets

METHOD FOR PPL AND CDR DESIGNS FOR ACHIEVING SPECIFIC BANDWIDTH AND PHASE MARGIN REQUIREMENTS

CROSS-REFERENCE TO RELATED APPLICATION(S)

The present application claims priority to and the benefit of U.S. Provisional Application No. 62/031,786, filed Jul. 31, 2014, entitled "METHOD FOR PLL AND CDR DESIGNS FOR ACHIEVING SPECIFIC BANDWIDTH AND PHASE MARGIN REQUIREMENTS", the entire content of which is incorporated herein by reference.

FIELD

One or more aspects of embodiments according to the present invention relate to loops for controlling voltage controlled oscillators and phase interpolators, and more particularly to a system and a method for selecting component values and/or manufacturing of a frequency controlled source loop.

BACKGROUND

The phase locked loop (PLL) and clock and data recovery (CDR) circuit are two major blocks of any digital communication system. The design of these blocks has a direct impact on the performance of the communication system. Several ways to define the figures of merit for these blocks may be translated into certain requirements in terms of the phase margin and the bandwidth of the loop. Because system requirements may include requirements on phase margin and bandwidth, there is a need for a system and a method for designing a PLL or CDR circuit for a given bandwidth and phase margin requirement.

SUMMARY

Aspects of embodiments of the present disclosure are directed toward a method for designing a PLL or CDR circuit, either of which may contain a loop with a voltage controlled oscillator or other frequency controlled source. For each of a set of values of a gain parameter and a first capacitor of the loop filter of this loop, an analytic solution is employed to find a value for a resistor and a second capacitor of the loop filter. Values of the resistor and the second capacitor that meet a design criterion are selected from among the calculated values.

According to an embodiment of the present invention there is provided a method for manufacturing a frequency controlled source loop having a divider ratio, a bandwidth, a phase margin, a first loop filter capacitance in a first capacitance range, a charge pump current, and a tuning gain, the method including: for each pair of values of a plurality of pairs of values, each pair of values including: the first loop filter capacitance, and a gain parameter proportional to the product of the charge pump current and the tuning gain, calculating a resistance-capacitance pair, including a loop filter resistance and a second loop filter capacitance, from: the bandwidth, the phase margin, the gain parameter, the divider ratio, and the first loop filter capacitance, the resistance-capacitance pair being one of a plurality of resistance-capacitance pairs, each of the plurality of resistance-capacitance pairs corresponding to a pair of values of the plurality of pairs of values, selecting a selected resistance-capacitance pair, from among the plurality of resistance-capacitance pairs, satisfying a criterion, and manufacturing the frequency controlled source loop with a resistor having a resistance, and a second loop filter capacitor having a capacitance, equal the loop filter resistance and the second loop filter capacitance, respectively, of the selected resistance-capacitance pair.

In one embodiment, the manufacturing of the frequency controlled source loop further includes manufacturing the frequency controlled source loop with a first loop filter capacitor having a capacitance equal to the first loop filter capacitance of the pair of values corresponding to the selected resistance-capacitance pair.

In one embodiment, the method includes: receiving a value of the tuning gain; selecting a nominal charge pump current and a nominal gain parameter; calculating a value of the charge pump current from the nominal charge pump current, the nominal gain parameter, and the gain parameter of the pair of values corresponding to the selected resistance-capacitance pair; and wherein the manufacturing of the frequency controlled source loop includes manufacturing the frequency controlled source loop with a charge pump current equal to the calculated value of the charge pump current.

In one embodiment, the calculating of the value of the charge pump current includes calculating the value of the charge pump current $I^*_{cp}$ from the equation $$I^*_{cp} = \frac{A^*}{A_{nom}} I^{nom}_{cp}$$

where $I_{cp}^{nom}$ is the nominal charge pump current, $A_{nom}$ is the nominal gain parameter, and $A^*$ is the gain parameter of the pair of values corresponding to the selected resistance-capacitance pair.

In one embodiment, the method includes: receiving a value of the charge pump current; selecting a nominal tuning gain and a nominal gain parameter; calculating a value of the tuning gain from the nominal tuning gain, the nominal gain parameter, and the gain parameter of the pair of values corresponding to the selected resistance-capacitance pair; and wherein the manufacturing of the frequency controlled source loop includes manufacturing the frequency controlled source loop with a tuning gain equal to the calculated value of the charge pump current.

In one embodiment, the calculating of the value of the tuning gain includes calculating the value of the tuning gain $K^*_{vco}$ from the equation $$K^*_{vco} = \frac{A^*}{A_{nom}} K^{nom}_{vco}$$

where $K_{vco}^{nom}$ is the nominal tuning gain, $A_{nom}$ is the nominal gain parameter, and $A^*$ is the gain parameter of the pair of values corresponding to the selected resistance-capacitance pair.

In one embodiment, the selecting of the selected resistance-capacitance pair, from among the plurality of resistance-capacitance pairs, satisfying the criterion includes selecting a subset of the plurality of resistance-capacitance pairs for which the loop filter resistance, of the resistance-capacitance pair is within a first resistance range.

In one embodiment, the selecting of the selected resistance-capacitance pair, from among the plurality of resistance-capacitance pairs, satisfying a criterion further includes selecting the selected resistance-capacitance pair, from the subset, having a minimum value of the second loop filter capacitance.

In one embodiment, the calculating of a resistance-capacitance pair includes: calculating a first intermediate value and a second intermediate value from: the bandwidth, the phase margin, the gain parameter, and the divider ratio, and calculating the resistance-capacitance pair, from: the first intermediate value, the second intermediate value, and the first loop filter capacitance.

In one embodiment, the selecting of the selected resistance-capacitance pair, from among the plurality of resistance-capacitance pairs, satisfying the criterion includes selecting a subset of the plurality of resistance-capacitance pairs for which the loop filter resistance, of the resistance-capacitance pair is within a first resistance range.

In one embodiment, the selecting of the selected resistance-capacitance pair, from among the plurality of resistance-capacitance pairs, satisfying a criterion further includes selecting the selected resistance-capacitance pair, from the subset, having a minimum value of the second loop filter capacitance.

In one embodiment, the calculating of the first intermediate value includes solving a fourth order equation.

In one embodiment, the calculating of the first intermediate value includes solving:

$$\frac{\varphi^2}{\omega_0^2}\alpha^4 - \frac{2\varphi}{\omega_0}\alpha^3 + (1-\lambda)(1+\varphi^2)\alpha^2 - 2\varphi\omega_0\alpha - (\lambda\varphi^2 + (\lambda-1))\omega_0^2 = 0$$

for $\alpha$, and setting the first intermediate value to a value of $\alpha$, where: $\varphi=\tan(PM)$; PM is the phase margin; $\omega_0$ is the bandwidth times $2\pi$;

$$\lambda \text{ is } \left(\frac{N\omega_0^2}{A}\right)^2;$$

with N being the divider ratio; and A being the gain parameter.

In one embodiment, the method includes testing the first intermediate value and the second intermediate value for feasibility.

In one embodiment, the testing of the first intermediate value and the second intermediate value for feasibility includes testing whether the first intermediate value and the second intermediate value satisfy the inequality: $\beta>\alpha>0$ wherein $\alpha$ is the first intermediate value, and $\beta$ is the second intermediate value.

In one embodiment, the manufacturing of the frequency controlled source loop includes manufacturing the frequency controlled source loop with a first loop filter capacitor having a capacitance equal to the first loop filter capacitance of the pair of values corresponding to the selected resistance-capacitance pair.

In one embodiment, the method includes: receiving a value of the tuning gain; selecting a nominal charge pump current and a nominal gain parameter; calculating a value of the charge pump current from the nominal charge pump current, the nominal gain parameter, and the gain parameter of the pair of values corresponding to the selected resistance-capacitance pair; and wherein the manufacturing of the frequency controlled source loop includes manufacturing the frequency controlled source loop with a charge pump current equal to the calculated value of the charge pump current.

In one embodiment, the calculating of the value of the charge pump current includes calculating the value of the charge pump $I^*_{cp}$ from the equation $$I^*_{cp} = \frac{A^*}{A_{nom}} I^{nom}_{cp};$$

where $I_{cp}^{nom}$ is the nominal charge pump current, $A_{nom}$ is the nominal gain parameter, and $A^*$ is the gain parameter of the pair of values corresponding to the selected resistance-capacitance pair.

According to an embodiment of the present invention there is provided a method for manufacturing a frequency controlled source loop having a divider ratio, a bandwidth, a phase margin, a first loop filter capacitance in a first capacitance range, a charge pump current, and a tuning gain, the method including: for each pair of values of a plurality of pairs of values, each pair of values including: the first loop filter capacitance, and a gain parameter proportional to the product of the charge pump current and the tuning gain, calculating a first intermediate value and a second intermediate value from: the bandwidth, the phase margin, the gain parameter, and the divider ratio, calculating a resistance-capacitance pair, including a loop filter resistance and a second loop filter capacitance, from: the first intermediate value the second intermediate value and the first loop filter capacitance, the resistance-capacitance pair being one of a plurality of resistance-capacitance pairs, each of the plurality of resistance-capacitance pairs corresponding to a pair of values of the plurality of pairs of values, selecting a selected resistance-capacitance pair, from among the plurality of resistance-capacitance pairs, satisfying a criterion, and manufacturing the frequency controlled source loop with a resistor having a resistance, and a second loop filter capacitor having a capacitance, equal the loop filter resistance and the second loop filter capacitance, respectively, of the selected resistance-capacitance pair wherein the calculating of the first intermediate value includes solving:

$$\frac{\varphi^2}{\omega_0^2}\alpha^4 - \frac{2\varphi}{\omega_0}\alpha^3 + (1-\lambda)(1+\varphi^2)\alpha^2 - 2\varphi\omega_0\alpha - (\lambda\varphi^2 + (\lambda-1))\omega_0^2 = 0$$

for $\alpha$, and setting the first intermediate value to a value of $\alpha$, where: $\varphi=\tan(PM)$; PM is the phase margin; $\omega_0$ is the bandwidth times $2\pi$;

$$\lambda \text{ is } \left(\frac{N\omega_0^2}{A}\right)^2;$$

with N being the divider ratio; and A being the gain parameter, and wherein the selecting of the selected resistance-capacitance pair, from among the plurality of resistance-capacitance pairs, satisfying a criterion further includes selecting the selected resistance-capacitance pair, from the subset, having a minimum value of the second loop filter capacitance.

According to an embodiment of the present invention there is provided a system for manufacturing a frequency controlled source loop with a divider ratio, a bandwidth, and a phase margin, with a first loop filter capacitance in a first capacitance range, with a charge pump current, and with a tuning gain, the system including: means for: for each pair of values of a plurality of pairs of values, each pair of values including: the first loop filter capacitance, and a gain parameter proportional to the product of the charge pump current and the tuning gain, calculating a resistance-capacitance pair, including a loop filter resistance and a second loop filter capacitance, from: the bandwidth, the phase margin, the gain parameter, the divider ratio, and the first loop filter capacitance, the resistance-capacitance pair being one of a plurality of resistance-capacitance pairs, each of the plurality of resistance-capacitance pairs corresponding to a pair of values of the plurality of pairs of values, and selecting a selected resistance-capacitance pair, from among the plurality of resistance-capacitance pairs, satisfying a criterion, and means for manufacturing the frequency controlled source loop with a resistor having a resistance, and a second loop filter capacitor having a capacitance, equal the loop filter resistance and the second loop filter capacitance, respectively, of the selected resistance-capacitance pair.

BRIEF DESCRIPTION OF THE DRAWINGS

These and other features and advantages of the present invention will be appreciated and understood with reference to the specification, claims and appended drawings wherein:

DETAILED DESCRIPTION

Figure 1:
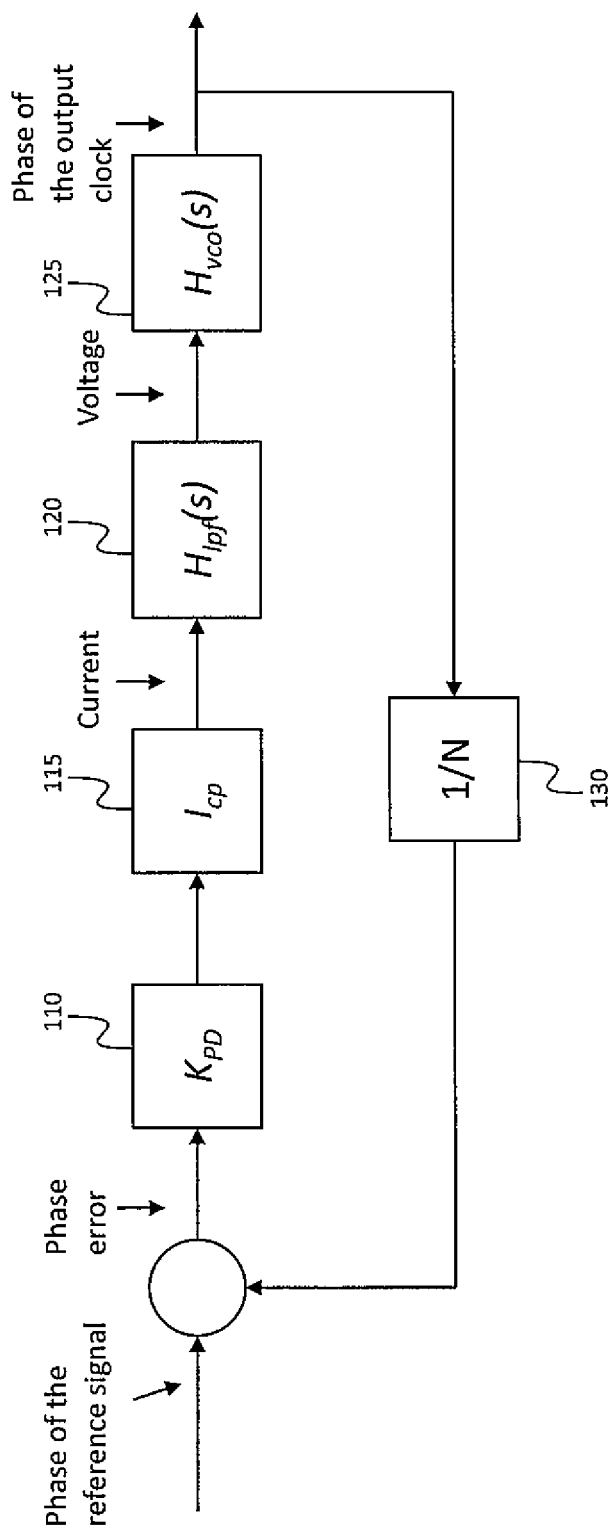
FIG. 1 is a block diagram of a CDR/PLL system according to an embodiment of the present invention.

The detailed description set forth below in connection with the appended drawings is intended as a description of exemplary embodiments of a method for PLL and CDR designs for achieving specific bandwidth and phase margin requirements provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

In a communication system, a clock generating a precise timing or clock signal may be used and the quality of this clock may have a direct impact on the link performance. A clock signal may be generated using a phase locked loop (PLL) and reconstructed in the receiver by a clock data recovery (CDR) circuit, two blocks that may be found in any digital communication systems. The design of these blocks may have a direct impact on the performance of the communication system. Various ways to define the figures of merit for these blocks may be used and any such figure of merit may correspond to certain requirements in terms of the phase margin (PM) and the bandwidth (BW) of the linear and time invariant model for a CDR/PLL system.

In one embodiment a systematic method is used to design a PLL or CDR system to achieve specific bandwidth and phase margin requirements. For a commonly used resistor-capacitor (RC) loop filter, the design of a PLL or CDR system involves determining the following five parameters: The VCO gain Kvco, charge pump current Icp, and one resistor R and two capacitors C1, C2 of the loop filter. Each of these parameters may have a limited range and in one embodiment these ranges are taken into consideration. In one embodiment a value of Kvco (or "$K_{vco}$") is the input parameter and values of Icp (or "$I_{cp}$"), R, C1 (or "$C_1$"), and C2 (or "$C_2$") are output parameters, i.e., values of which are found. In another embodiment the value of Icp is fixed and the values of other parameters are found.

As used herein, a phase locked loop (PLL) is a closed loop feedback system which generates a high frequency clock from a low frequency reference clock. The reference clock may be generated by a crystal oscillator or by another PLL. Several sources of error may affect the performance of a PLL. Reference clock jitter, e.g., temporal changes of the period of the reference clock, may be a source of performance degradation, which may be mitigated to the extent the PLL filters the jitter in the reference clock and generates a low jitter high frequency clock. Other sources of jitter may also affect the performance of a PLL, and the bandwidth of PLL may be chosen as a trade-off between rejecting various jitter sources.

In baseband digital communication, where data are encapsulated in consecutive symbols (e.g., 1 bit per symbol for non-return-to-zero coding (NRZ), 2 bits per symbol for four-level pulse amplitude modulation (PAM-4), etc.), a CDR circuit may be used to insure that the symbol length is substantially the same in the receiver as in the transmitter. CDR may be performed using only the incoming data (e.g., using an embedded clock (EC)) or using a forwarded clock (FC) the frequency of which may be a fraction of the data rate. A CDR circuit may use the transitions in the data to recover both the frequency and phase of the data transitions, or only to recover the phase, if a forwarded clock is available as a frequency reference. A CDR circuit may be designed as a feedback loop to lock the local clock to the incoming data (or incoming clock).

While serving different purposes, CDR and PLL circuits are similar systems, which both produce a clock that locks to an incoming signal while reducing or minimizing output jitter, and as such they may be analyzed and synthesized similarly. These systems may have several blocks in common: a phase detector (PD), a conversion block such as a charge pump, a loop filter, a frequency controlled source such as a voltage controlled oscillator or a phase interpolator with an accumulator at its input, and a frequency divider. In either a CDR or a PLL circuit, the frequency controlled source may be part of a closed-loop control system referred to herein as a "frequency controlled source loop", which may be part of a CDR/PLL system.

The phase detector in a CDR/PLL system may be used to extract the phase difference between the data (or a forwarded clock) and the local clock. A phase detector may fall into one of two categories. A linear phase detector (a first category) may have an output that is linearly related to the phase difference for two input signals, and a bang bang phase detector (BBPD) (a second category) may have an output that is the sign of the phase difference. A BBPD may be nonlinear in operation; this may be an obstacle to the use of linear time invariant (LTI) system analysis for a system including a BBPD. If a BBPD is run at low speed, however, and multiple BBPDs are used in parallel, then it may be possible to use a linear approximation, which may be valid for sufficiently small phase differences. Thus, in suitable circumstances, a phase detector, whether it is a linear phase detector or a bang bang phase detector, may be modeled (e.g., approximated) by a constant gain referred to as Kpd (or $K_{PD}$). This constant gain Kpd may be 1/(2*pi) for a linear phase detector and may be 2/pi for a bang bang phase detector.

The conversion block in a CDR/PLL system may condition the phase difference signal produced by the phase detector, and may be implemented in one of several ways. For example, a charge pump generating current proportional to the phase difference may be used (in an analog CDR circuit), or the phase difference may be sampled and digitized for digital processing (in a digital CDR circuit). In the latter approach the digitization may involve averaging, if the digital CDR is not fast enough to run at the data rate. In both cases, the conversion block may be modeled by a simple multiplication, by a factor of Icp, referred to herein as the charge pump current. As used herein, a charge pump current means the gain factor of an element used as a conversion block; as such, the charge pump current may be a current provided by a charge pump, when a charge pump is used as the conversion block.

A loop filter may be used to shape the CDR loop open loop frequency response to meet certain performance requirements. Depending on the kind of CDR, the loop filter may be digital or analog. The order and type of loop filter may influence the behavior of a PLL or CDR circuit.

A frequency controlled source may be used to produce a signal with variable frequency (or, equivalently, variable phase) controlled by the output of the loop filter. A frequency controlled source may for example be a voltage controlled oscillator (VCO), the output frequency of which is linearly related to its input voltage (i.e., the voltage at the control input of the VCO). A VCO may be modeled by the equation fout=f0+Kvco*Vin where fout is the output frequency, f0 is the central frequency, Vin is the input voltage, and Kvco (e.g., in units of Hz/V) is the VCO tuning gain.

As another example, the frequency controlled source may be a phase interpolator (PI) the output phase of which is linearly related to its input. A PI may be preceded by a digital accumulator which is the digital equivalent of an integrator that converts frequency to phase. Because the PI changes the phase of the clock in linear relation with the input voltage, the combination of an accumulator and a PI behaves in the same way as VCO, i.e., it also may be modeled by the equation fout=f0+Kvco*Vin. As used herein, a frequency controlled source is any circuit having an output and an input, the frequency of a signal at the output being substantially equal to fout=f0+Kvco*Vin, where Vin is an input signal, f0 is a nominal "reference" frequency, and Kvco is a gain constant referred to as the tuning gain. Thus, both a VCO and a phase interpolator preceded by a digital accumulator are frequency controlled sources within the terminology used herein.

A frequency divider that divides the output frequency of the frequency controlled source by an integer factor N may be used in the feedback path of the PLL system such that the PLL generates a high frequency clock from a low frequency clock.

The bandwidth of the frequency controlled source loop (e.g., the PLL or CDR loop) may be in the MHz range while the data rates may be greater than 1 GHz, i.e., the sampling frequency may be 1000 times greater than the loop bandwidth. As such, a digital CDR or PLL loop may be modeled as an analog system.

Figure 2:
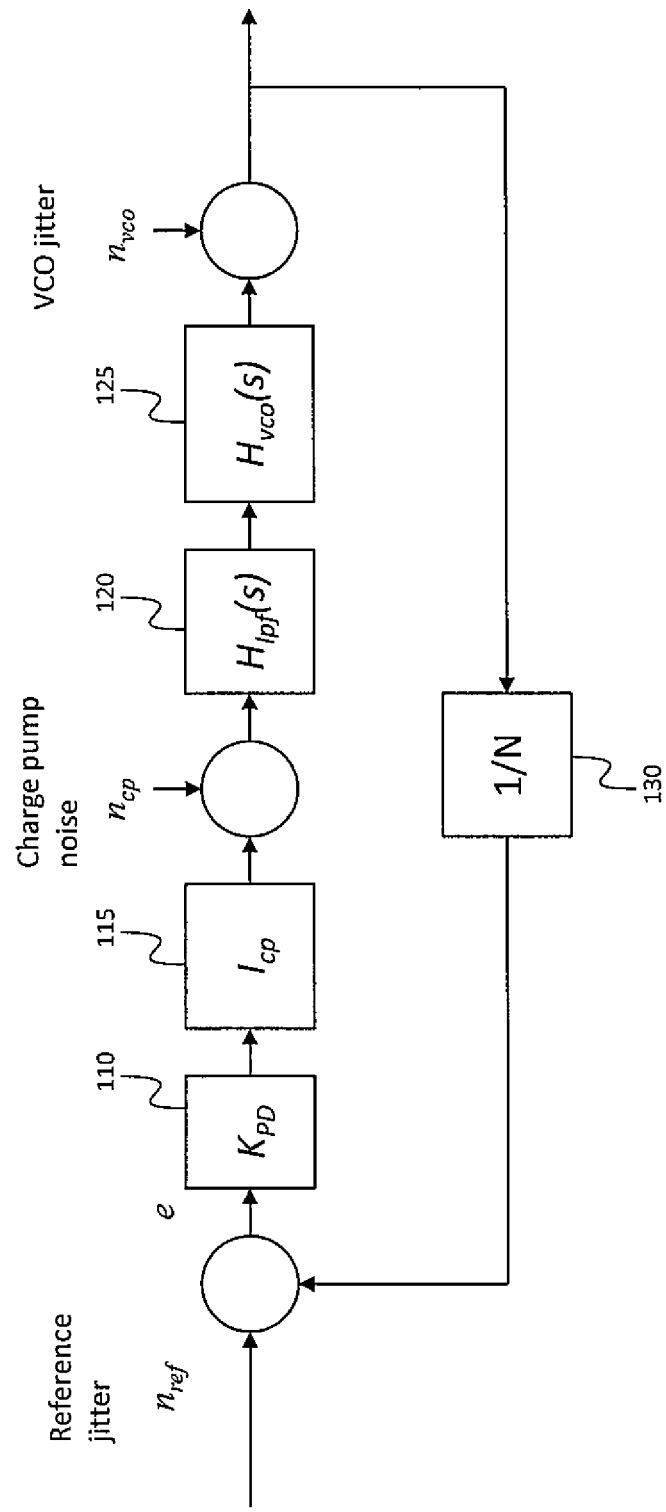
FIG. 2 is a block diagram of a CDR/PLL system, showing possible error sources, according to an embodiment of the present invention.

Thus, the block diagram of FIG. 1 may be sufficiently general to cover different kinds of PLL and CDR systems. The embodiment of FIG. 1 includes a phase detector 110, a charge pump 115, a loop filter 120, a frequency controlled source 125, and a divider 130. A linear time-invariant (LTI) block diagram can be used to compute the output jitter from the noise sources (e.g., reference jitter, charge pump noise, and VCO jitter) as shown in FIG. 2. If other noise or jitter sources are present in the system, they may also be added to the model.

Figure 3:
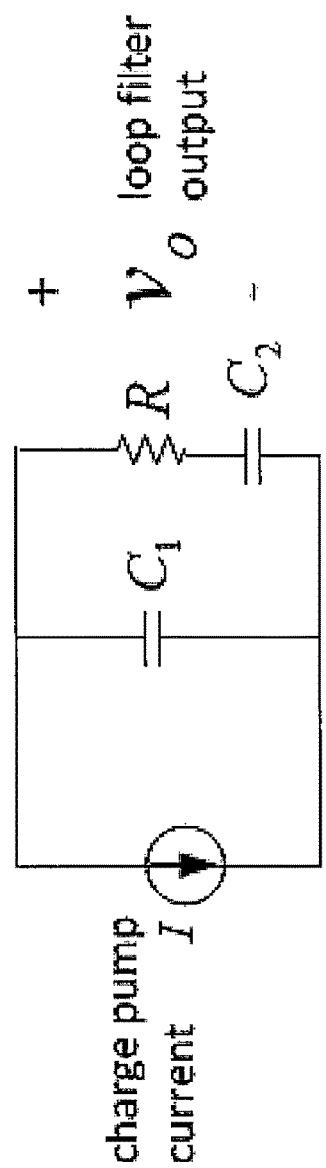
FIG. 3 is a schematic diagram of a charge pump and loop filter, according to an embodiment of the present invention.

The loop filter may be a resistor-capacitor (RC) circuit, as illustrated for example in FIG. 3, having three design parameters, a loop filter resistor with a resistance R, a first loop filter capacitor with a capacitance C1, and a second loop filter capacitor with a capacitance C2. The symbols for the resistor and capacitors may be used interchangeably herein with symbols for their respective resistance or capacitances.

The divider ratio N of the frequency divider may be fixed, depending on the frequency of the reference clock and the data rate. Thus, the parameters to be selected in the design of a PLL or CDR system may be Kvco, Icp, R, C1, and C2. Of these, Kvco may be dictated by circuit constraints, and may not be a free design parameter. The remaining four parameters, Icp, R, C1, and C2, may each be chosen within a respective range to meet certain performance criteria. In this embodiment, certain parameters, such as the bandwidth, phase margin, divider ratio and Kvco are inputs to the design process, i.e., they are "received" by the process, and other parameters, such as Icp, R, C1, and C2 are outputs of the design process, i.e., they are produced by the design process. The range within which each parameter is to be chosen may be dictated by component size limitations, noise performance requirements, or other constraints.

The figures of merit for a PLL or CDR loop may include stability, input tracking, and jitter rejection, which may be translated into bandwidth (BW) and phase margin (PM). Higher bandwidth may result in better tracking of the input (e.g., for spread spectrum clocking), and lower bandwidth may result in high rejection of reference jitter, and low rejection of VCO jitter. Higher phase margin may result in a more stable loop.

Thus the task of designing a PLL or CDR loop may involve finding values for Icp, R, C1, and C2, given requirements on the bandwidth and phase margin of the loop. An exhaustive search over all four parameters within their respective ranges may however be an intractable problem which may require an unacceptable amount of time to complete. Related art trial- and error approaches in which a user tests various combinations of values of Icp, R, C1, and C2, and in which a software package provides the bandwidth and phase margin, may also be impractical because a large number of combinations may need to be tested; moreover, such an approach may not result in a determination of whether the requirements are feasible, i.e., whether the requirement can be met for any set of available values of Icp, R, C1, and C2.

Figure 4:
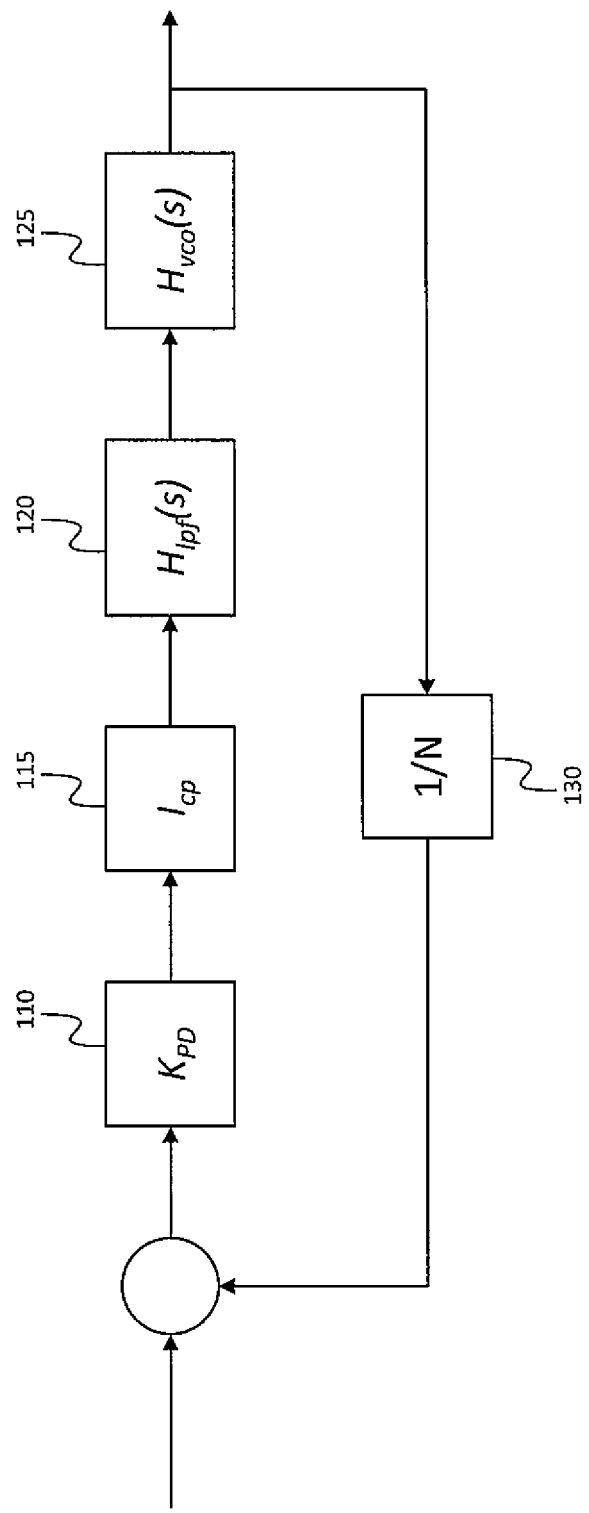
FIG. 4 is a block diagram of the CDR/PLL system, according to an embodiment of the present invention.

In one embodiment, a combination of an analytical computation with a sweep over two parameter is used to determine, in a reasonable amount of time, whether the requirements are feasible and to find values for Icp, R, C1, and C2 if the requirements are feasible. The following definitions are used:

Referring to FIG. 4, the open loop transfer function $H_{op}(s)$ is given by:

$$H_{op}(s) = \frac{1}{N}K_{PD}I_{cp}H_{lpf}(s)H_{vco}(s) = \frac{A}{N}\frac{s+\alpha}{s^2(s+\beta)}$$

with the gain parameter A defined as $$A = \frac{2\pi K_{PD}I_{cp}K_{vco}}{c_1},$$

where $H_{vco}(s) = \frac{2\pi K_{vco}}{s}$

The bandwidth is defined to be a frequency $$f_0 = \frac{\omega_0}{2\pi}$$

such that:

$|H_{op}(j\omega)|=1$

The phase margin is defined to be the difference between the phase at $\omega_0$ and $-180$ degrees:

PM=180°+∠$H_{op}(j\omega_0)$

It follows that:

$$|H_{op}(j\omega_0)| = \left|\frac{A}{N\omega_0^2}\frac{j\omega_0+\alpha}{j\omega_0+\beta}\right| = \frac{A}{N\omega_0^2}\sqrt{\frac{\alpha^2+\omega_0^2}{\beta^2+\omega_0^2}} = 1 \quad (I)$$

$$\angle H_{op}(j\omega_0) = -180° + \angle\frac{j\omega_0+\alpha}{j\omega_0+\beta},$$

which implies that $$PM = \angle\frac{j\omega_0+\alpha}{j\omega_0+\beta} = \angle\frac{(j\omega_0+\alpha)(-j\omega_0+\beta)}{\omega_0^2+\beta^2},$$

which, in turn, implies that $$PM = \angle\frac{(\omega_0^2+\alpha\beta)+j\omega_0(\beta-\alpha)}{\omega_0^2+\beta^2}$$

Then, φ is defined as follows:

$$\varphi = \tan(PM) = \frac{\omega_0(\beta-\alpha)}{\omega_0^2+\alpha\beta} \quad (II)$$

After some simplification, equations (I) and (II) result in:

$$\beta = \frac{\alpha+\varphi\omega_0}{1-\frac{\varphi\alpha}{\omega_0}} \quad (III)$$

and $$\frac{\varphi^2}{\omega_0^2}\alpha^4 - \frac{2\varphi}{\omega_0}\alpha^3 + (1-\lambda)(1+\varphi^2)\alpha^2 - 2\varphi\omega_0\alpha - (\lambda\varphi^2+(\lambda-1))\omega_0^2 = 0 \quad (IV)$$

where $\lambda = \left(\frac{N \cdot \omega_0^2}{A}\right)^2$.

Equation (IV) is a fourth order equation in a. In one embodiment it is solved using any of several kinds of root finder known to those of skill in the art. For the requirements to be feasible, (IV) must have a real solution for a which satisfies $$\beta > \alpha > 0, \quad (V)$$

because $$\alpha = \frac{1}{RC_2} \text{ and } = \frac{1}{R}\left(\frac{1}{C_1} + \frac{1}{C_2}\right).$$

Thus, constraint inequality (V) may be used for testing any candidate solution for feasibility. If there is a solution meeting the feasibility condition of inequality (V), R and C2 may be found from the following:

$$R = \frac{1}{\alpha C_2} \quad (VI)$$

$$C_2 = \left(\frac{\beta}{\alpha}-1\right)C_1 \quad (VII)$$

Equations (VI) and (VII) then lead to a procedure for finding values for the parameters Icp, R, C1, and C2. The procedure begins with initial estimated values for C1 and Icp, referred to as C1nom and Icpnom respectively (which may also be written $C_1^{nom}$ and $I_{cp}^{nom}$ respectively), and which are used to calculate an initial value for A, referred to as Anom (or $A_{nom}$), and C2 and R are found from bandwidth and phase margin requirements.

Specifically, a is found from the given parameter values by solving equation (IV), and then β is found by evaluating equation (III). The feasibility of the solution is tested using constraint inequality (V). If the solution is feasible, then R and C2 are found from α and β using equations (VI) and (VII).

When this procedure is followed, values of C2 and R may be found, for a particular Icp and C1. However, if constraint (V) is not satisfied, the problem may have a solution for a different Icp and C1, and if constraint (V) is satisfied, there may be other values for R and C2 that lead to a better design, e.g., one that can be manufactured at lower cost.

Thus, the procedure may be repeated, varying A from its nominal value Mom by an allowable fraction, which is referred to as X, for a set of, e.g., 100 values of A, equally spaced between (1−X)*Anom and (1+X)*Anom. The value of X may be determined by how much Icp may be changed while keeping the noise and circuit component size acceptable. In one embodiment X is 0.5.

Figure 5:
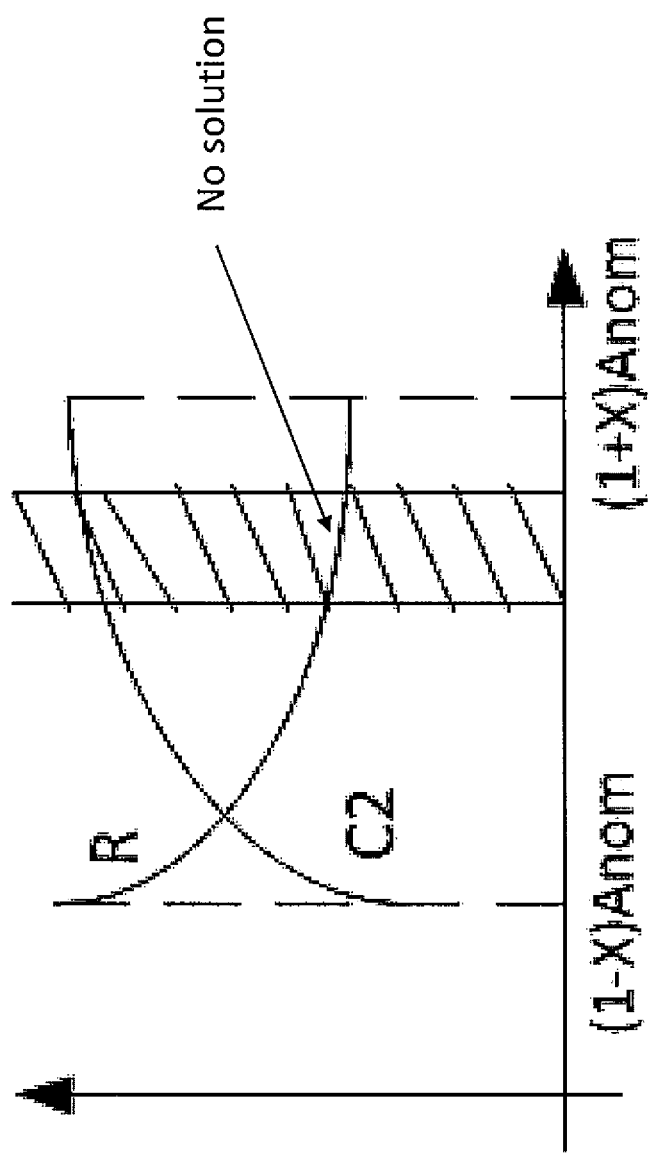
FIG. 5 is a graph of a resistor value and a second capacitor value as a function of an overall gain constant, according to an embodiment of the present invention.

Referring to FIG. 5, varying A and solving for R and C2 for each value of A may result, for example, in curves for R and C2 as shown. Each value of A results in a resistance-capacitance pair (i.e., a pair of values, for R and C2, respectively) corresponding to the value of A. From the available resistance-capacitance pairs, desired (or optimum) values of R and C2 (and a corresponding value of A) may then be selected (and referred to as a "selected resistance-capacitance pair") based on a criterion such as (i) finding the smallest value for C2 while keeping R in the acceptable resistance range for R, (ii) finding the smallest value for R while keeping C2 in the acceptable range for C2, or (iii) finding values of R and C2 such that another factor (e.g., loop peaking) is optimum. Once R, C2 and A have been selected (with values referred to as R*, C*$_2$, and A*, respectively), Icp may be found from $$I_{cp}^* = \frac{A^*}{A_{nom}} I_{cp}^{nom}.$$

The entire procedure may then be repeated for multiple values of C1 over a first capacitance range, finding, in similar fashion, R*, C*$_2$, and A* for each value of C1 in an acceptable range for C1 (e.g., between values referred to as C1$min$ and C1$max$). The set of values which best meet the criterion are then the globally optimum values (i.e., optimized over all combinations of values of A and C1 tested); these values are referred to as Ropt, C2opt, and Aopt (or $R^{opt}$, $C_2^{opt}$, and $A^{opt}$). $I_{cp}^{opt}$ may then be found from $$I_{cp}^{opt} = \frac{A^{opt}}{A_{nom}} I_{cp}^{nom}.$$

Figure 6:
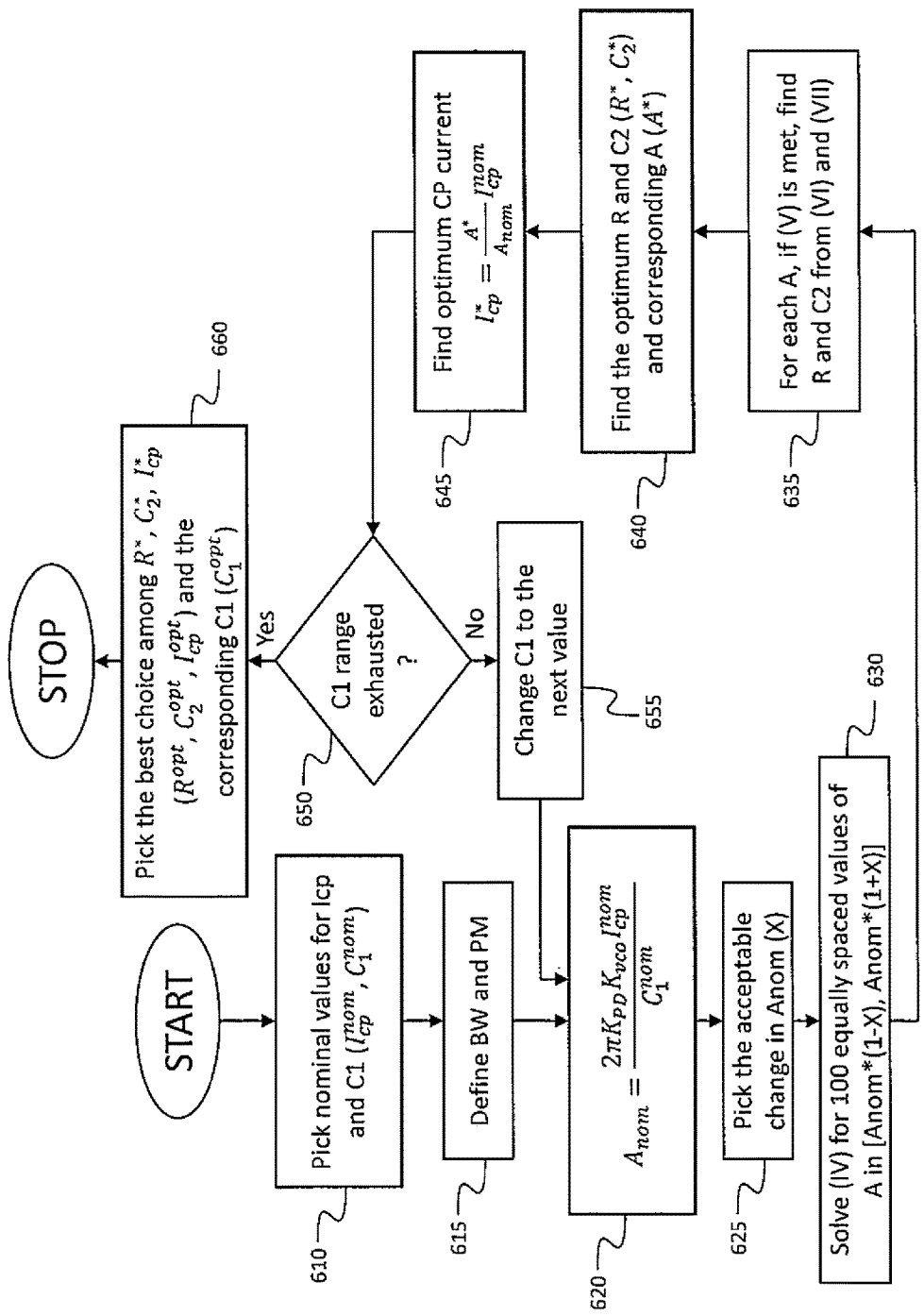
FIG. 6 is a flowchart of a method for finding design parameter values for a frequency controlled source loop, according to an embodiment of the present invention.

Specifically, referring to FIG. 6, in one embodiment Kvco is constant (e.g., it is constrained to a particular value by a system design requirement), and other design parameters are varied. In an act 610, nominal values of Icp (the nominal charge pump current) and C1 are selected, and the BW and PM are defined (or may be provided, as system design requirements) in an act 615. An initial value of C1 is set. In an act 620, Anom (the nominal gain parameter) is calculated, using $$A_{nom} = \frac{2\pi K_{PD} I_{cp}^{nom} K_{vco}}{C_1^{nom}}$$

The acceptable change in Anom (X) is selected in an act 625. In an act 630, equation (IV) is solved for, e.g., 100 equally spaced values of A in the interval [Anom*(1−X), Anom*(1+X)], and for each A, if the constraint of inequality (V) is met, R and C2 corresponding to that value of A are found using equations (VI) and (VII), in an act 635. Acts 630 and 635 may be executed, for example, by a loop (or an "inner loop") over an index ranging from 1 to 100, each value of the index corresponding to a different value of A to be tested. In an act 640, the optimum values of R and C2 are found from among the set of resistance capacitance pairs (i.e., R and C2 pairs) found for the set of values of A tested, and in an act 645, the optimum value of the charge pump current is found. In an act 650, the current value of C1 is checked to see whether it is the last value to be tested, and, if not, then C1 is changed to the next value to be tested, and a new set of tests, over 100 values of A, is performed. The values of C1 may range, for example, from C1$min$ to C1$max$ or from C1$max$ to C1$min$. If the current value of C1 is the last value to be tested, then, in an act 660, all of the optimal values found in acts 640 and 645 for various values of A are evaluated to find overall optimum values of R, C2, and Icp; these are referred to as $R^{opt}$, $C_2^{opt}$, and $I_{cp}^{opt}$, and are the final design values to be used, e.g., to manufacture the CDR/PLL system.

Figure 7:
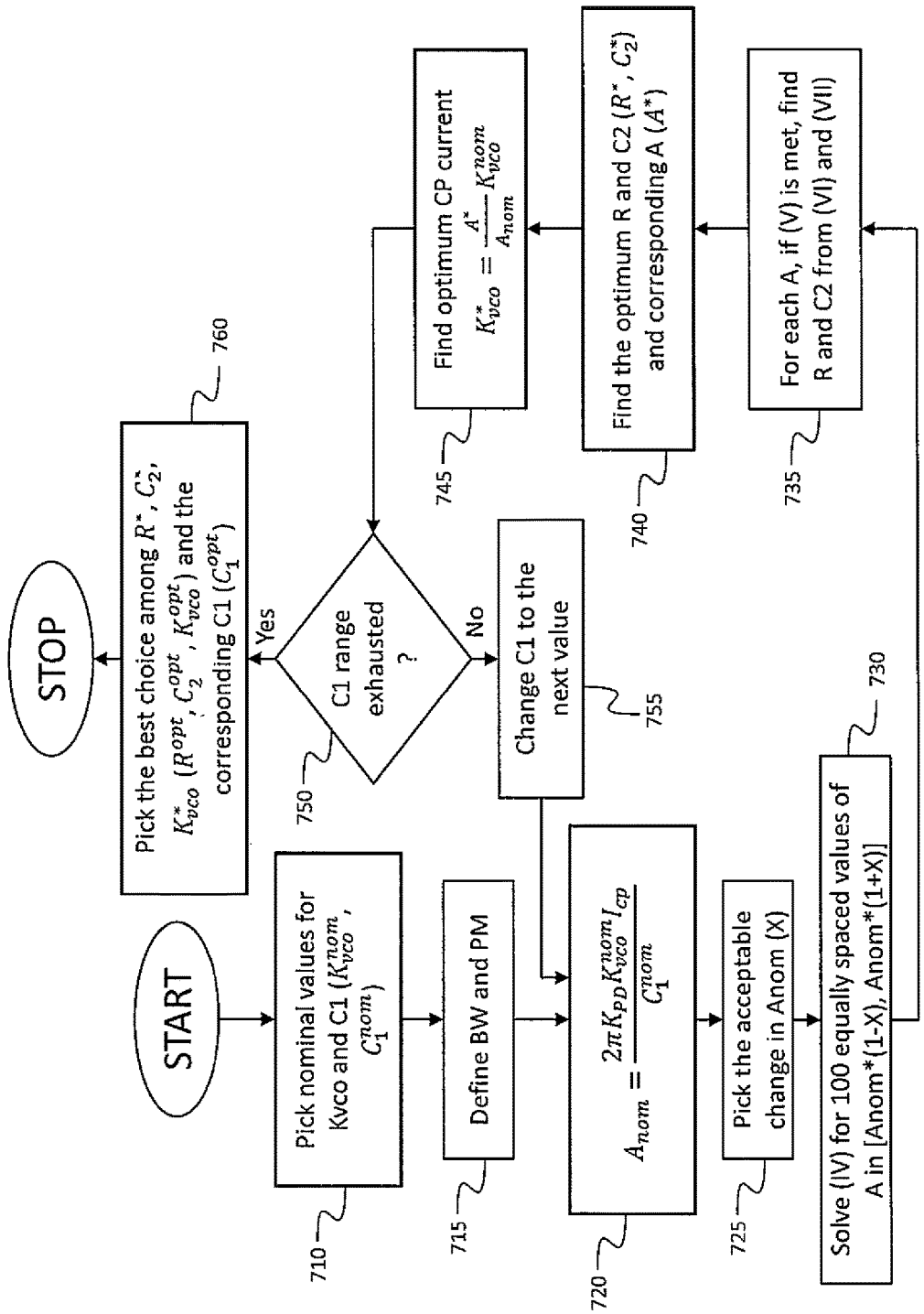
FIG. 7 is a flowchart of a method for finding design parameter values for a frequency controlled source loop, according to another embodiment of the present invention.

Referring to FIG. 7, in another embodiment a similar process is used when Icp is fixed (e.g, it is constrained to a particular value by a system design requirement) and a value of Kvco is to be found. In an act 710, nominal values of Kvco and C1 are selected, and the BW and PM are defined (or may be provided, as system design requirements) in an act 715. An initial value of C1 is set. In an act 720, Anom is calculated, and the acceptable change in Anom (X) is selected in an act 725. In an act 730, equation (IV) is solved for, e.g., 100 equally spaced values of A in the interval [Anom*(1−X), Anom*(1+X)], and for each A, if the constraint of inequality (V) is met, R and C2 corresponding to that value of A are found using equations (VI) and (VII), in an act 735. Acts 730 and 735 may be executed, for example, by a loop (or an "inner loop") over an index ranging from 1 to 100, each value of the index corresponding to a different value of A to be tested. In an act 740, the optimum values of R and C2 are found from among the set of resistance capacitance pairs (i.e., R and C2 pairs) found for the set of values of A tested. In an act 745, the optimum value of the frequency controlled source gain Kvco is found, using the equation:

$$K_{vco}^* = \frac{A^*}{A_{nom}} K_{vco}^{nom}$$

where $K_{vco}^{nom}$ is the nominal tuning gain, and is the optimum value of A over the set of values tested in the inner loop.

Figure 10:
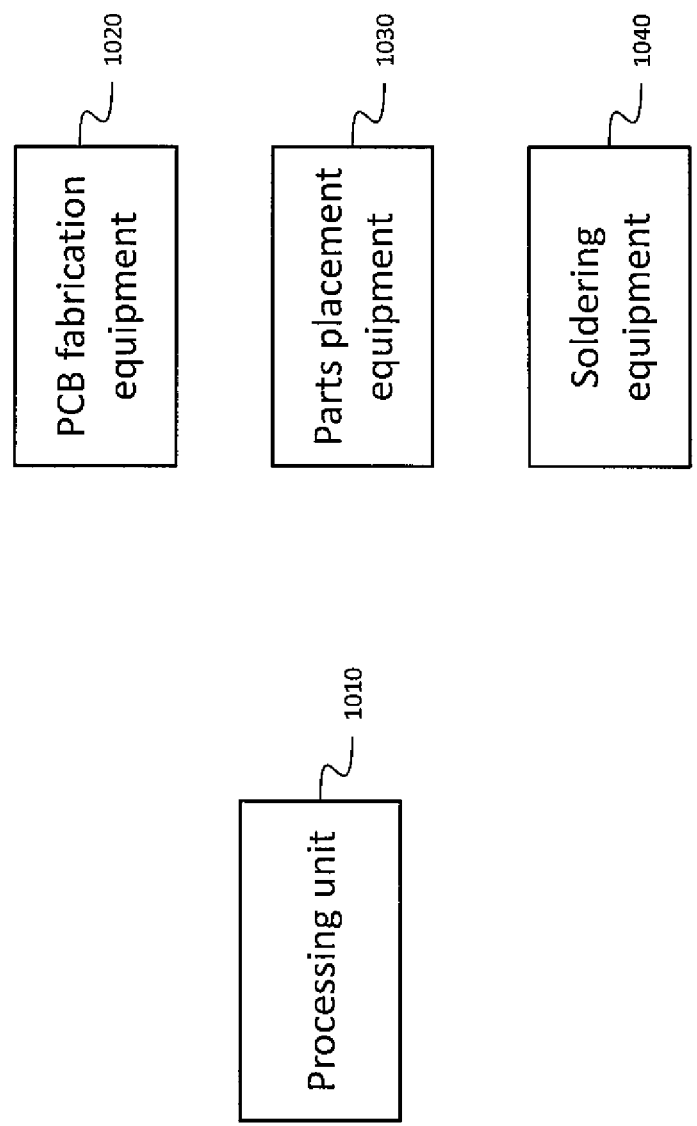
FIG. 10 is a block diagram of a system for designing and fabricating a CDR/PLL system, according to an embodiment of the present invention.

In an act 750, the current value of C1 is checked to see whether it is the last value to be tested, and, if not, then C1 is changed to the next value to be tested, and a new set of tests, over 100 values of A, is performed. The values of C1 may range, for example, from C1$min$ to C1$max$ or from C1$max$ to C1$min$. If the current value of C1 is the last value to be tested, then, in an act 760, all of the optimal values found in acts 740 and 745 for various values of A are evaluated to find overall optimum values of R, C2, and Kvco; these are referred to as $R^{opt}$, $C_2^{opt}$, and $K_{vco}^{opt}$, and are the final design values to be used, e.g., to manufacture a CDR/PLL system. Referring to FIG. 10, a frequency controlled loop may be designed using a processing unit 1010 (or a processing unit connected to a memory), and fabricated using, for example, printed circuit board fabrication equipment 1020, parts placement equipment 1030, and soldering equipment 1040.

The term "processing unit" is used herein to include any combination of hardware, firmware, and software, employed to process data or digital signals. Processing unit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing unit, as used herein, each function is performed either by hardware configured, i.e., hard-wired, to perform that function, or by more general purpose hardware, such as a CPU, configured to execute instructions stored in a non-transitory storage medium. A storage medium such as a memory may be part of the processing unit, or it may be a separate component. A processing unit may be fabricated on a single printed wiring board (PWB) or distributed over several interconnected PWBs. A processing unit may contain other processing units; for example a processing unit may include two processing units, an FPGA and a CPU, interconnected on a PWB.

EXAMPLE

Figure 8:
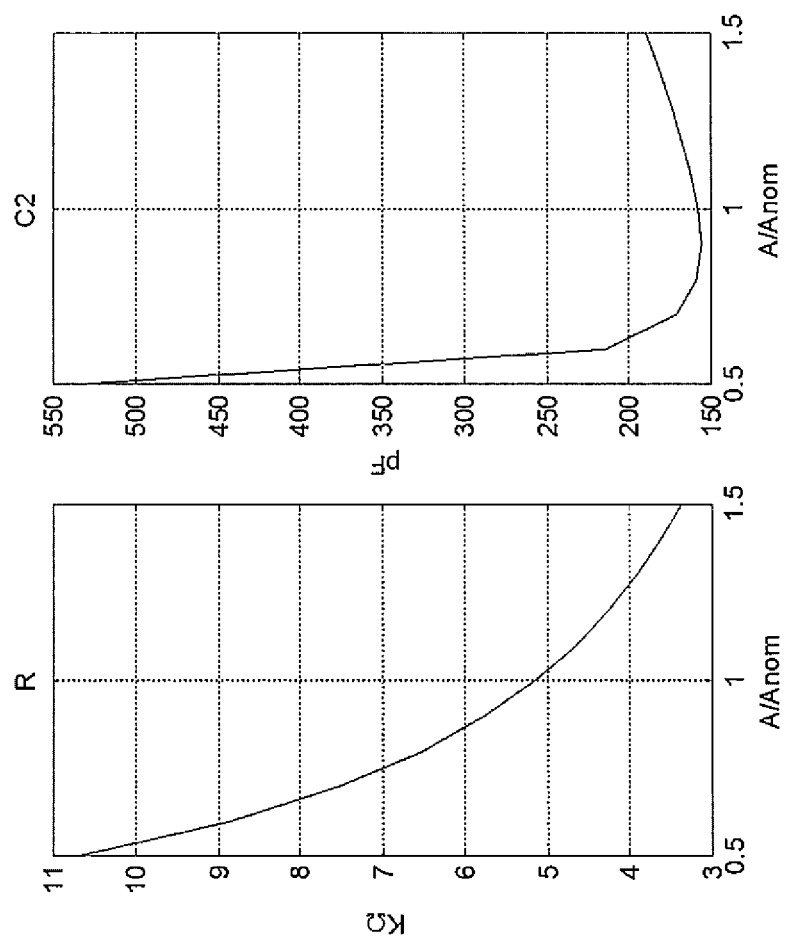
FIG. 8 shows graphs of a resistor value and a second capacitor value, as a function of a gain parameter value, according to an embodiment of the present invention.

For example, if a loop with a bandwidth of 1 MHz, a phase margin of 70 degrees and a divider ratio of N=32 is to be designed for a VCO with Kvco=400 MHz/V, and if initial values of Icp=100 µA and C1=5 pF are to be used, then varying A in 100 equally spaced steps between values of 0.5*Anom and 1.5*Anom (i.e., a range of values corresponding to X=0.5), the set of resistance-capacitance pairs (i.e., R-C2 pairs) plotted in FIG. 8 may be found, and if a solution with the smallest possible value of C2 is sought, then Aopt=0.9*Anom will be used, leading to design parameter values of:

C1=5 pF,
C2=156 pF,
R=5.6 kΩ, and
Icp=0.9*100 µA=90 µA.

Figure 9:
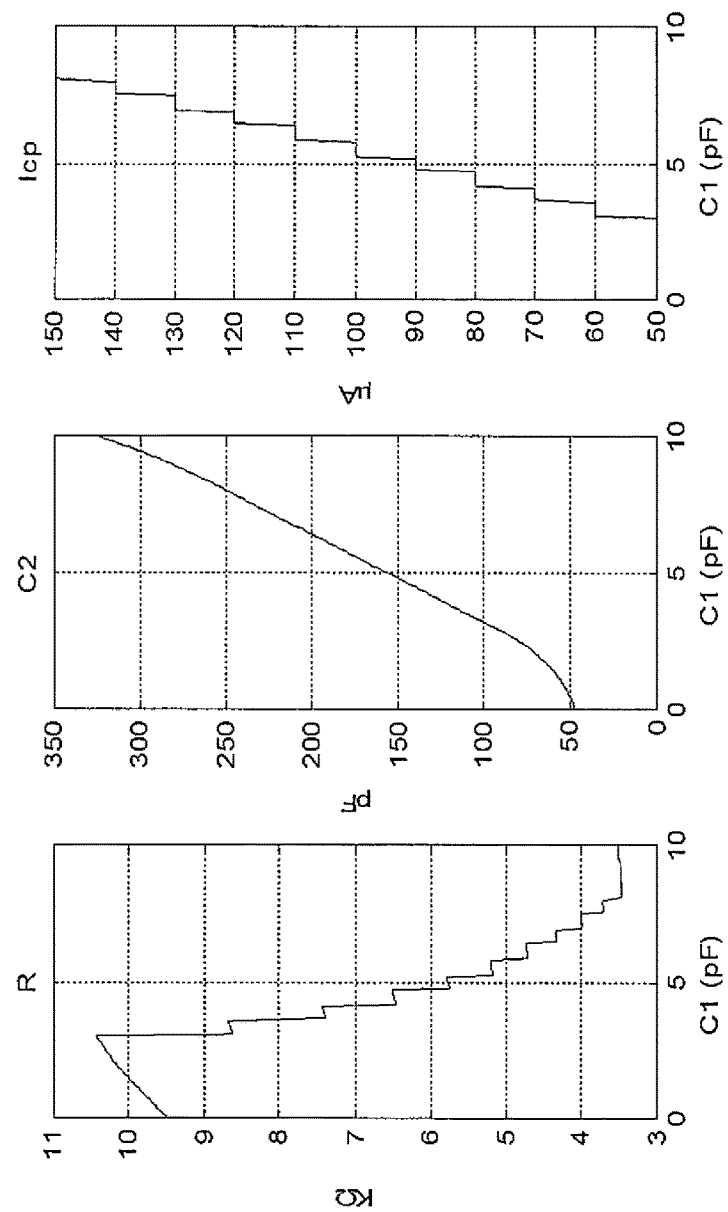
FIG. 9 shows graphs of a resistor value, a second capacitor value, and a charge pump current, as a function of first capacitor value, according to an embodiment of the present invention.

This optimization over the range of values of A may then be repeated, in an outer loop, over a range of values of C1, e.g., from 0.1 pF to 10 pF, resulting in values of R, a C2, and Icp as functions of C1, as shown in FIG. 9. Again selecting the solution with the smallest value of C2 results in selecting C1=0.1 pF, which leads to C2=47 pF and R=9.5 kΩ. For this solution, the design parameters are:

Icp=50 µA,
C1=0.1 pF,
C2=47 pF, and
R=9.5 kΩ.

These parameters (along with the previous assumptions that Kvco=400 MHz/V and N=32) lead to a bandwidth of 1 MHz, a phase margin of 70 degrees, and peaking of 21.0%.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" means a component constituting at least half, by weight, of a composition, and the term "major portion", when applied to a plurality of items, means at least half of the items.

As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

The CDR/PLL system and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of CDR/PLL system may be formed on one integrated circuit (IC) chip or on separate IC chips. Further, the various components of the CDR/PLL system may be implemented on a flexible printed circuit film, a tape carrier package (TCP), a printed circuit board (PCB), or formed on a same substrate as the CDR/PLL system. Further, the various components of the CDR/PLL system may be a process or thread, running on one or more processors (which may be separate and independent from the processing unit 1010 that may be used to design the CDR/PLL system), in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

Although exemplary embodiments of a method for PLL and CDR designs for achieving specific bandwidth and phase margin requirements have been specifically described and illustrated herein, many modifications and variations will be apparent to those skilled in the art. Accordingly, it is to be understood that a method for PLL and CDR designs for achieving specific bandwidth and phase margin requirements practiced according to principles of this invention may be embodied other than as specifically described herein. The invention is also defined in the following claims, and equivalents thereof.

What is claimed is:

1. A method for manufacturing a frequency controlled source loop having a divider ratio, a bandwidth, a phase margin, a first loop filter capacitance in a first capacitance range, a charge pump current, and a tuning gain, the method comprising:
for each gain-capacitance pair of a plurality of gain-capacitance pairs, each gain-capacitance pair comprising:
the first loop filter capacitance, and
a gain parameter proportional to the product of the charge pump current and the tuning gain,
calculating a resistance-capacitance pair, comprising a loop filter resistance and a second loop filter capacitance, from:
the bandwidth,
the phase margin,
the gain parameter,
the divider ratio, and
the first loop filter capacitance,
the resistance-capacitance pair being one of a plurality of resistance-capacitance pairs, each of the plurality of resistance-capacitance pairs corresponding to a gain-capacitance pair of the plurality of gain-capacitance pairs, selecting a first resistance-capacitance pair, from among the plurality of resistance-capacitance pairs, satisfying a criterion, and
manufacturing the frequency controlled source loop with a resistor having a resistance equal the loop filter resistance of the first resistance-capacitance pair, and with a second loop filter capacitor having a capacitance equal the the second loop filter capacitance of the first resistance-capacitance pair,
wherein the frequency controlled source loop comprises:
a voltage controlled oscillator, a rate of change of frequency with respect to input voltage of the voltage controlled oscillator being equal to the tuning gain;
a loop filter comprising:
the resistor,
a first loop filter capacitor, and
the second loop filter capacitor, the resistor being connected to the first loop filter capacitor and to the second loop filter capacitor;
a charge pump configured to generate an output current equal to the charge pump current; and
a frequency divider configured to receive a first signal having a first frequency and to produce a second signal having a second frequency, the ratio of the first frequency to the second frequency being the divider ratio,
the voltage controlled oscillator, the loop filter, the charge pump, and the frequency divider are connected in a loop.

2. The method of claim 1, wherein the manufacturing of the frequency controlled source loop further comprises manufacturing the frequency controlled source loop with a first loop filter capacitor having a capacitance equal to the first loop filter capacitance of the gain-capacitance pair corresponding to the first resistance-capacitance pair.

3. The method of claim 1, further comprising:
receiving a value of the tuning gain;
selecting a nominal charge pump current and a nominal gain parameter;
calculating a value of the charge pump current from the nominal charge pump current, the nominal gain parameter, and the gain parameter of the gain-capacitance pair corresponding to the first resistance-capacitance pair; and
wherein the manufacturing of the frequency controlled source loop comprises manufacturing the frequency controlled source loop with a charge pump current equal to the calculated value of the charge pump current.

4. The method of claim 3, wherein the calculating of the value of the charge pump current comprises calculating the value of the charge pump current $I^*_{cp}$ from the equation $$I^*_{cp} = \frac{A^*}{A_{nom}} I^{nom}_{cp}$$

where $I_{cp}^{nom}$ is the nominal charge pump current, $A_{nom}$ is the nominal gain parameter, and $A^*$ is the gain parameter of the gain-capacitance pair corresponding to the first resistance-capacitance pair.

5. The method of claim 1, further comprising:
receiving a value of the charge pump current;
selecting a nominal tuning gain and a nominal gain parameter;

calculating a value of the tuning gain from the nominal tuning gain, the nominal gain parameter, and the gain parameter of the gain-capacitance pair corresponding to the first resistance-capacitance pair; and wherein the manufacturing of the frequency controlled source loop comprises manufacturing the frequency controlled source loop with a tuning gain equal to the received value of the charge pump current.

6. The method of claim 5, wherein the calculating of the value of the tuning gain comprises calculating the value of the tuning gain $K^*_{vco}$ from the equation $$K^*_{vco} = \frac{A^*}{A_{nom}} K^{nom}_{vco}$$

where $K_{vco}^{nom}$ is the nominal tuning gain, $A_{nom}$ is the nominal gain parameter, and $A^*$ is the gain parameter of the gain-capacitance pair corresponding to the first resistance-capacitance pair.

7. The method of claim 1, wherein the selecting of the first resistance-capacitance pair, from among the plurality of resistance-capacitance pairs, satisfying the criterion comprises selecting a subset of the plurality of resistance-capacitance pairs for which the loop filter resistance, of the resistance-capacitance pair is within a first resistance range.

8. The method of claim 7 wherein the selecting of the first resistance-capacitance pair, from among the plurality of resistance-capacitance pairs, satisfying the criterion further comprises selecting the first resistance-capacitance pair, from the subset, having a minimum value of the second loop filter capacitance.

9. The method of claim 1, wherein the calculating of a resistance-capacitance pair comprises:
calculating a first intermediate value and a second intermediate value from:
the bandwidth,
the phase margin,
the gain parameter, and
the divider ratio, and
calculating the resistance-capacitance pair, from:
the first intermediate value,
the second intermediate value, and
the first loop filter capacitance.

10. The method of claim 9, wherein the selecting of the first resistance-capacitance pair, from among the plurality of resistance-capacitance pairs, satisfying the criterion comprises selecting a subset of the plurality of resistance-capacitance pairs for which the loop filter resistance, of the resistance-capacitance pair is within a first resistance range.

11. The method of claim 10 wherein the selecting of the first resistance-capacitance pair, from among the plurality of resistance-capacitance pairs, satisfying the criterion further comprises selecting the first resistance-capacitance pair, from the subset, having a minimum value of the second loop filter capacitance.

12. The method of claim 9, wherein the calculating of the first intermediate value comprises solving a fourth order equation.

13. The method of claim 12, wherein the calculating of the first intermediate value comprises solving:

$$\frac{\varphi^2}{\omega_0^2}\alpha^4 - \frac{2\varphi}{\omega_0}\alpha^3 + (1-\lambda)(1+\varphi^2)\alpha^2 - 2\varphi\omega_0\alpha - (\lambda\varphi^2 + (\lambda-1))\omega_0^2 = 0$$

for $\alpha$, and setting the first intermediate value to a value of a, where:
$\varphi = \tan(PM)$
PM is the phase margin;
$\omega_0$ is the bandwidth times $2\pi$;

$$\lambda \text{ is } \left(\frac{N\omega_0^2}{A}\right)^2;$$

with
N being the divider ratio; and
A being the gain parameter.

14. The method of claim 9, further comprising testing the first intermediate value and the second intermediate value for feasibility.

15. The method of claim 14, wherein the testing of the first intermediate value and the second intermediate value for feasibility comprises testing whether the first intermediate value and the second intermediate value satisfy the inequality:

$\beta > \alpha > 0$ wherein $\alpha$ is the first intermediate value, and
$\beta$ is the second intermediate value.

16. The method of claim 9, wherein the manufacturing of the frequency controlled source loop comprises manufacturing the frequency controlled source loop with a first loop filter capacitor having a capacitance equal to the first loop filter capacitance of the gain-capacitance pair corresponding to the first resistance-capacitance pair.

17. The method of claim 9, further comprising:
receiving a value of the tuning gain;
selecting a nominal charge pump current and a nominal gain parameter;
calculating a value of the charge pump current from the nominal charge pump current, the nominal gain parameter, and the gain parameter of the gain-capacitance pair corresponding to the first resistance-capacitance pair; and
wherein the manufacturing of the frequency controlled source loop comprises manufacturing the frequency controlled source loop with a charge pump current equal to the calculated value of the charge pump current.

18. The method of claim 17, wherein the calculating of the value of the charge pump current comprises calculating the value of the charge pump current $I^*_{cp}$ from the equation $$I^*_{cp} = \frac{A^*}{A_{nom}} I^{nom}_{cp}$$

where $I_{cp}^{nom}$ is the nominal charge pump current, $A_{nom}$ is the nominal gain parameter, and $A^*$ is the gain parameter of the gain-capacitance pair corresponding to the first resistance-capacitance pair.

* * * * *